United States Patent [19]

Welty

[11] Patent Number: 4,994,758

[45] Date of Patent: Feb. 19, 1991

[54] ALPHA ENHANCEMENT OF A TRANSISTOR USING BASE CURRENT FEEDBACK TO THE EMITTER

[75] Inventor: Dennis L. Welty, Mesa, Ariz.

[73] Assignee: Motorola, Inc., Schaumburg, Ill.

[21] Appl. No.: 450,954

[22] Filed: Dec. 15, 1989

[51] Int. Cl.⁵ .............................................. H03F 1/30
[52] U.S. Cl. ..................................... 330/288; 330/296
[58] Field of Search ............... 330/288, 296, 290, 257; 323/315, 316; 307/296.1

[56] References Cited

U.S. PATENT DOCUMENTS

| | | | |
|---|---|---|---|
| 4,297,646 | 10/1981 | LoCascio et al. | 330/288 |
| 4,507,573 | 3/1985 | Nagano | 323/315 X |
| 4,525,683 | 6/1985 | Jason | 330/288 |
| 4,730,124 | 3/1988 | Metz | 330/288 X |

Primary Examiner—Steven Mottola
Attorney, Agent, or Firm—Michael D. Bingham

[57] ABSTRACT

A circuit for enhancing the alpha of a transistor. A current supplying circuit passes the base current of the transistor through a first and second current mirror for providing current at the emitter of the transistor such that the apparent emitter current of the transistor is made substantially equal to the collector current of the transistor.

21 Claims, 2 Drawing Sheets

ALPHA ENHANCEMENT OF A TRANSISTOR USING BASE CURRENT FEEDBACK TO THE EMITTER

BACKGROUND OF THE INVENTION

The present invention relates to bipolar transistors and, more particularly, to enhancing the alpha of a bipolar transistor.

The alpha (a) of the transistor is defined to be the ratio of its collector current to its emitter current ($I_C/I_E$). Ideally, we would like a to be unity, but due to the base current, $I_E$ is larger than $I_C$ and, thus, a is less than unity. Furthermore, it is common to sense or measure the current in the emitter leg of a transistor and have the collector coupled to additional circuitry for transmitting this measured current. This is typically done since the circuitry coupled to the collector of a transistor may be high voltage while the circuitry coupled to the emitter is usually low voltage. Therefore, any difference in the emitter and collector currents of a transistor can present a problem when precision between the two is required.

One method of enhancing the alpha of a transistor is well known as the Darlington method which involves taking the base current of a transistor to be alpha enhanced, and passing it through a driver transistor wherein their collectors are tied together. The objective of the Darlington method is to effectively add in the base current of the transistor to be enhanced to its collector current so that the collector and emitter currents are equal thereby making the alpha of the transistor to be enhanced equal to unity. However, a problem with the Darlington method is that since both transistors have their collectors tied together, if the transistor to be enhanced must be selected for high voltage, then so must the driver transistor and, thus, requiring two transistors with high breakdown voltages. The problem is further increased when the alpha enhancement circuitry, in this case the driver transistor, is desired to be incorporated on an integrated circuit which is used to drive an external transistor that is to be alpha enhanced. Since the collectors of the external and driver transistors are tied together, the enhancement circuitry on the integrated circuit must also be designed for high voltage which will require much die area on an integrated circuit.

Hence, a need exists for an improved circuit to enhance the alpha of a transistor that is independent of the signal at the collector of the transistor to be enhanced so that the circuit can be designed for low voltage signals.

SUMMARY OF THE INVENTION

Accordingly, it is an object of the present invention to provide a circuit for enhancing the alpha of a transistor.

Another object of the present invention is to provide an alpha enhancing circuit that is independent of the signal at the collector of the transistor to be alpha enhanced.

In carrying out the above and other objects of the invention, there is provided a circuit for enhancing the alpha of a transistor by which the apparent emitter current of the transistor is made substantially equal to its collector current, comprising current supplying circuit responsive to an input voltage signal and coupled to the base of the transistor to be alpha enhanced for passing base current thereto; a first current mirror having an input coupled to the current supplying circuit for passing current that is substantially equal to the base current of the transistor to be enhanced; and a second current mirror having an input coupled to an output of the first current mirror and an output for providing current to the emitter of the transistor to be enhanced which is a function of the base current of the transistor to be enhanced multiplied by the product of the gains of the first and second current mirrors such that the alpha of the transistor is increased.

The above and other objects, features and advantages of the present invention will be better understood from the following detailed description taken in conjunction with the accompanying drawings.

DETAILED DESCRIPTION OF THE INVENTION

Figure 1:
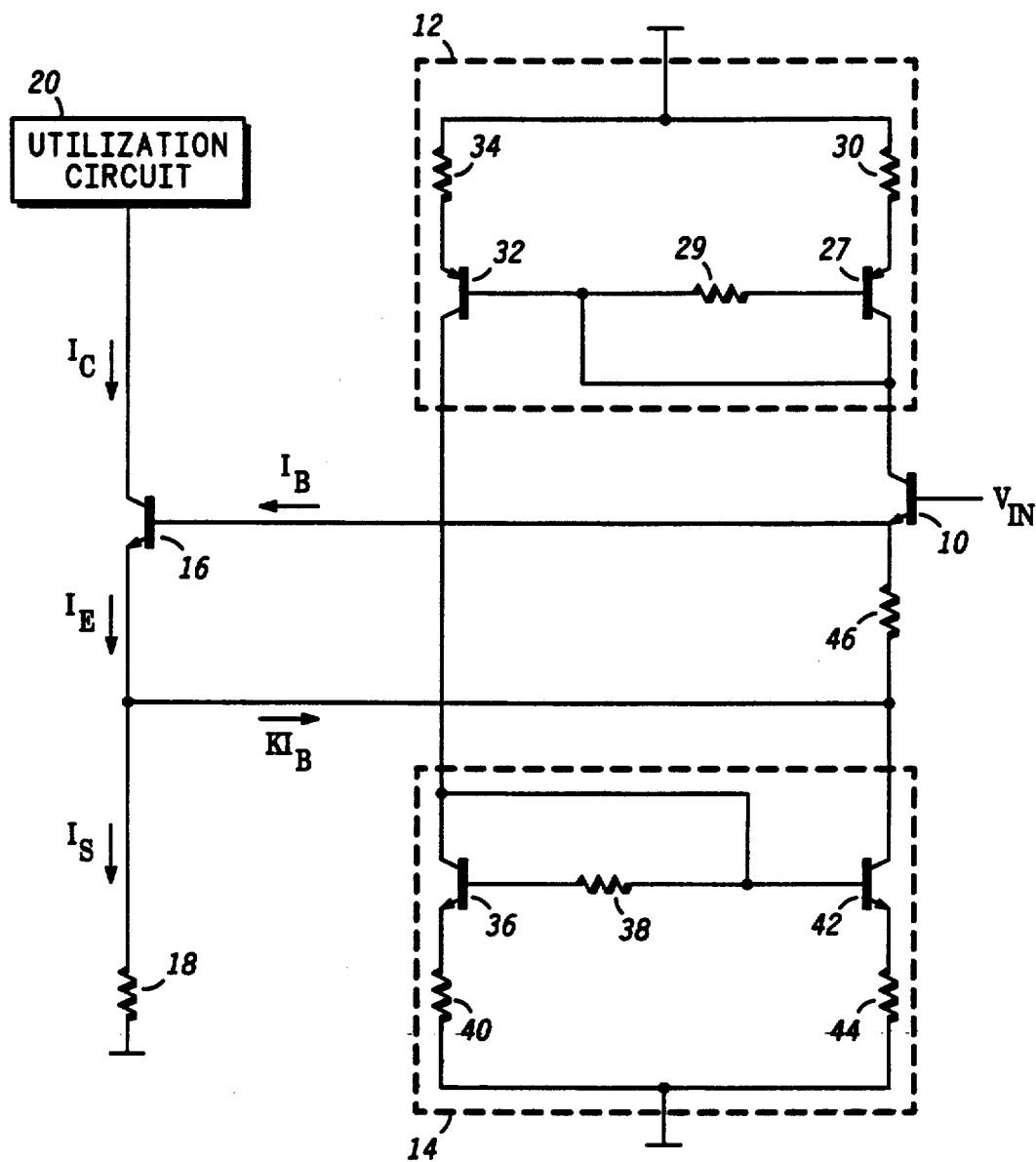
FIG. 1 is a detailed schematic diagram illustrating a first embodiment of the present invention.

Referring to FIG. 1, a detailed schematic diagram illustrating one embodiment of the present invention is shown comprising a current supplying circuit which includes transistor 10 having a collector coupled to an input of current mirror 12 which the latter has an output coupled to an input of current mirror 14 whose output is coupled to the emitter of transistor 16. The base of transistor 10, coupled to an input voltage signal, serves a similar role as did the base of transistor 16 such that any connection intended for the base of transistor 16 is now connected to the base of transistor 10. The emitter of transistor 10 is coupled to the base of transistor 16, while the emitter of transistor 16 is coupled to a first supply voltage terminal by resistor 18 for passing current $I_S$. It is understood the emitter of transistor 16 can be coupled to any utilization circuit that is capable of passing current thereby replacing resistor 18. Finally, the collector of transistor 16 is coupled to utilization circuit 20 which is capable of passing current.

Current mirror 12 includes transistor 27 having a collector coupled to its base by resistor 29 and to the input of current mirror 12, and an emitter coupled to a second supply voltage terminal by resistor 30. A transistor 32 having a collector coupled to the output of current mirror 12, a base coupled to the collector of transistor 27, and an emitter coupled to the second supply voltage terminal by resistor 34.

Current mirror 14 comprises transistor 36 having a collector coupled to its base by resistor 38 and to the input of current mirror 14, and an emitter coupled to a third supply voltage terminal by resistor 40. It is worth noting that a diode may be used to replace transistor 36 and resistor 38 of current mirror 14 as well as transistor 27 and resistor 29 of current mirror 12. A transistor 42 has a collector coupled to the output of current mirror 14, a base coupled to the collector of transistor 36, and an emitter coupled to the third supply voltage terminal by resistor 44. The circuit further includes resistor 46 coupled between the output of current mirror 14 and the emitter of transistor 10 for providing a minimum quiescent operating current through transistor 10.

In operation, a voltage is applied to the base of transistor 10 which defines a current through transistor 16 that is sensed or measured via resistor 18. It is desired to have the collector current of transistor 16 substantially equal to its emitter current, but due to the base current of transistor 16, the emitter current of transistor 16 is larger than its collector current. However, transistor 10 and current mirrors 12 and 14 provide a circuit for enhancing the alpha of transistor 16 such that the new or apparent emitter current of transistor 16, $I_S$, which is measured via resistor 18, is less than the emitter current of transistor 16, $I_E$, and, thus, the apparent alpha of transistor 16, defined as the ratio of the collector current of transistor 16 to the current through resistor 18, $I_C/I_S$, is greater than the standard alpha of ratio $I_C/I_E$. Furthermore, since the collector of transistor 16 is not connected to the alpha enhancement circuit by any means, the alpha enhancement circuit can be designed for low voltage signals even if high voltage signals exist at the collector of transistor 16.

Alpha enhancement of transistor 16 is accomplished by passing the base current of transistor 16 through transistor 10 such that the collector current of transistor 10 is substantially equal to the base current of transistor 16, neglecting a small error term comprising the base current of transistor 10. The collector current of transistor 10 is then passed or mirrored through current mirrors 12 and 14 such that the output of current mirror 14 sinks current from the emitter of transistor 16. By making the product of the gains of current mirrors 12 and 14 substantially equal to unity, the current sunk from the output of current mirror 14 is substantially equal to the base current of transistor 16, neglecting the small loss of current through resistor 46. Therefore, the apparent emitter current of transistor 16, $I_S$, which is the emitter current of transistor 16 lessened by the base current of transistor 16, is substantially equal to the collector current of transistor 16 and, thus, the apparent alpha of transistor 16 is substantially equal to unity. It should be obvious that by increasing the product of the gains of current mirrors 12 and 14, the current loss through resistor 46 as well as the base current loss through transistor 10 can be compensated to yield an apparent alpha of precisely unity. Furthermore and in a similar manner, the apparent alpha of transistor 16 can be made greater than unity, if so desired.

The method of alpha enhancement for transistor 16 may also be described by using mathematical equations. The general equation for the currents through transistor 16 of FIG. 1 is well known as:

$$I_C = I_E - I_B \qquad (1)$$

where $I_C$, $I_E$ and $I_B$ are the currents through the collector, emitter and base of transistor 16, respectively.

By applying Kirchoff's current law (KCL) at the emitter of transistor 16 of FIG. 1 and neglecting the base current of transistor 10 and the current through resistor 46, equation 2 can be obtained.

$$I_E = I_S + (K \times I_B) \qquad (2)$$

where $I_E$ is the emitter current through transistor 16;
$I_S$ is the current through resistor 18;
$I_B$ is the base current of transistor 16; and
K is the product of the gains of current mirrors 12 and 14.

By substituting the expression for $I_E$ of equation 2 into equation 1, equation 3 is obtained.

$$I_C = I_S - I_B \times (1 - K) \qquad (3)$$

Furthermore, the apparent alpha of transistor 16 can be calculated by taking the ratio of $I_C/I_S$ as shown in equation 4.

$$a = I_C/I_S = 1 + I_B/I_S \times (K - 1) \qquad (4)$$

Equation 4 as well as equation 3 again reveal as aforedescribed that for a value of K substantially equal to unity, the apparent alpha of transistor 16 is substantially equal to unity. Furthermore, by ascertaining K greater than unity, the apparent alpha of transistor 16 can be made greater than unity if so desired.

Figure 2:
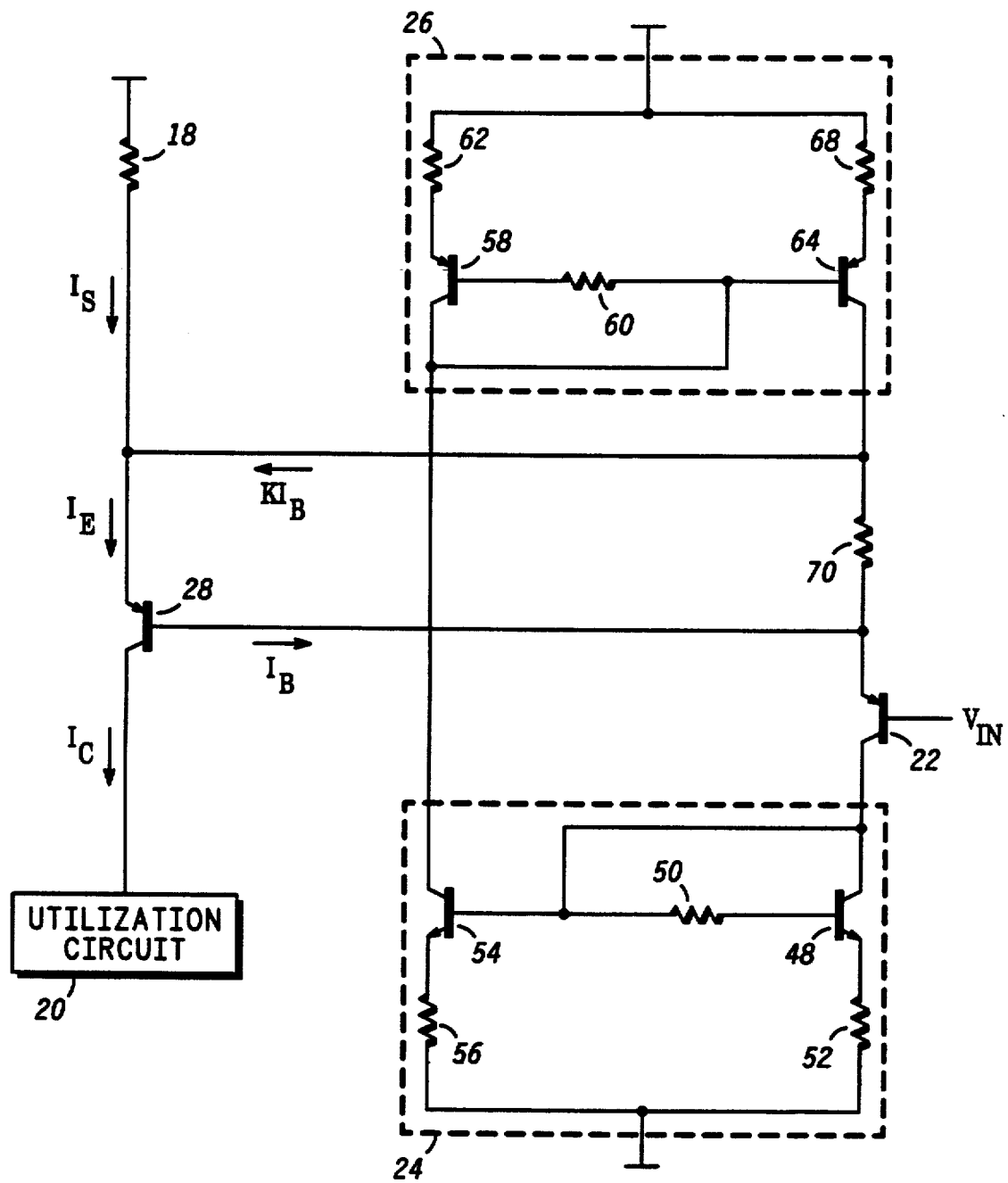
FIG. 2 is a detailed schematic diagram illustrating a second embodiment of the present invention.

Referring to FIG. 2, a detailed schematic of a second embodiment of the present invention shows how to perform alpha enhancement of PNP transistor 28. The components of FIG. 2 similar to those of FIG. 1 have been designated by the same reference numerals. A current supplying circuit comprising transistor 22 has its collector coupled to the input of current mirror 24 which the latter has an output coupled to an input of current mirror 26 whose output is coupled to the emitter of transistor 28. The base of transistor 22, coupled to an input voltage signal, serves a similar role as did the base of transistor 28 such that any connection intended for the base of transistor 28 is now connected to the base of transistor 22. The emitter of transistor 22 is coupled to the base of transistor 28 while the emitter of transistor 28 is coupled to a first supply voltage terminal by resistor 18 for passing current $I_S$. Finally, the collector of transistor 28 is coupled to utilization circuit 20 which is capable of passing current.

Current mirror 24 comprises transistor 48 having a collector coupled to its base by resistor 50 and to the input of current mirror 24, and an emitter coupled to a second supply voltage terminal by resistor 52. Transistor 54 has a collector coupled to the output of current mirror 24, a base coupled to the collector of transistor 48, and an emitter coupled to the second supply voltage terminal by resistor 56.

Current mirror 26 comprises transistor 58 having a collector coupled to its base by resistor 60 and to the input of current mirror 26, and an emitter coupled to a third supply voltage terminal by resistor 62. Similarly, a diode may be used to replace transistor 58 and resistor 60 of current mirror 26 as well as transistor 48 and resistor 50 of current mirror 24. Transistor 64 has a collector coupled to the output of current mirror 26, a base coupled to the collector of transistor 58, and an emitter coupled to the third supply voltage terminal by resistor 68. The circuit further includes resistor 70 coupled between the output of current mirror 26 and the emitter of transistor 22 for providing a minimum quiescent operating current through transistor 22.

The operation of the circuit shown in FIG. 2 is very similar to the circuit shown in FIG. 1. As before, a voltage is applied to the base of transistor 22 which defines a current through transistor 28 that is sensed or measured via resistor 18. Transistor 22 and current mirrors 24 and 26 provide a circuit for enhancing the alpha of transistor 28 such that the new or apparent emitter current of transistor 28, $I_S$, is less than the emitter current of transistor 28, $I_E$, and, thus, the apparent alpha ($I_C/I_S$) of transistor 28 is increased.

Alpha enhancement of transistor 28 is accomplished by passing the base current of transistor 28 through transistor 22 such that the collector current of transistor 22 is substantially equal to the base current of transistor 28, neglecting a small error term comprising the base current of transistor 22. The collector current of transistor 22 is then passed through current mirrors 24 and 26 such that the output of current mirror 26 sources current to the emitter of transistor 28. By making the product of the gains of current mirrors 24 and 26 substantially equal to unity, the current sourced from the output of current mirror 26 is substantially equal to the base current of transistor 28, neglecting the small loss of current through resistor 70. Therefore, the apparent emitter current of transistor 28, $I_S$, which is the emitter current of transistor 28, $I_E$ lessened by its base current, is substantially equal to the collector current of transistor 28 thereby ascertaining the apparent alpha of transistor 28 substantially equal to unity.

Furthermore, the mathematical approach utilizing equations 1 and 2 still apply for the circuit shown in FIG. 2, therefore equations 3 and 4 can also be derived for the circuit of FIG. 2 in the aforedescribed manner.

By now it should be appreciated that there has been provided a novel circuit that successfully enhances the alpha of an NPN or PNP transistor independent of the signal at the collector of the NPN or PNP transistor.

What is claimed is:

1. A circuit for enhancing the alpha of a transistor such that the apparent emitter current of the transistor is made substantially equal to the collector current of the transistor which is sourced from a utilization means, comprising:
   current supplying means coupled to an input signal and to the base of the transistor for passing base current thereto;
   a first current mirror having an input responsive to said current supplying means for passing current thereto which is substantially equal to the base current of the transistor, and an output; and
   a second current mirror having an input coupled to said output of said first current mirror and an output coupled to the emitter of the transistor for sinking current therefrom which is a function of the base current of the transistor amplified by a gain of said first and second current mirrors such that the apparent alpha of the transistor is increased.

2. The circuit according to claim 1 wherein said first current mirror includes:
   a first transistor having a collector coupled to said input of said first current mirror, a base coupled to said collector of said first transistor of said first current mirror, and an emitter coupled to a first supply voltage terminal; and
   a second transistor having a collector coupled to said output of said first current mirror, a base coupled to said collector of said first transistor of said first current mirror, and an emitter coupled to said first supply voltage terminal.

3. The circuit according to claim 2 wherein said second current mirror includes:
   a first transistor having a collector coupled to said input of said second current mirror, a base coupled to said collector of said first transistor of said second current mirror, and an emitter coupled to a second supply voltage terminal; and
   a second transistor having a collector coupled to said output of said second current mirror, a base coupled to said collector of said first transistor of said second current mirror, and an emitter coupled to said second supply voltage terminal.

4. The circuit according to claim 3 wherein said current supplying means includes:
   a transistor having a collector coupled to said input of said first current mirror, a base coupled to said input signal, and an emitter coupled to said base of the transistor.

5. The circuit according to claim 4 which further includes:
   first resistive means coupled between the emitter of the transistor and a third supply voltage terminal for sensing current thereto; and
   second resistive means coupled between said emitter of said transistor of said current supplying means and said output of said second current mirror for providing a minimum operating current through said transistor of said current supplying means.

6. The circuit according to claim 5 wherein said first current mirror further includes:
   a first resistor coupled between said base and said collector of said first transistor;
   a second resistor coupled between said emitter of said first transistor and said first supply voltage terminal; and
   a third resistor coupled between said emitter of second transistor and said first supply voltage terminal.

7. The circuit according to claim 6 wherein said second current mirror further includes:
   a first resistor coupled between said base and said collector of said first transistor;
   a second resistor coupled between said emitter of said first transistor and said second supply voltage terminal; and
   a third resistor coupled between said emitter of second transistor and said second supply voltage terminal.

8. The circuit according to claim 1 wherein the circuit further includes:
   resistive means coupled between said emitter of the transistor and a first supply voltage terminal for sensing current thereto.

9. An alpha enhancing circuit, comprising:
   a transistor whose alpha is to be enhanced by making the apparent emitter current of said transistor substantially equal to the collector current of said transistor which is sourced from a utilization means;
   a driver transistor having an emitter coupled to said base of said transistor for passing base current thereto, a base coupled to an input signal, and a collector;
   a first current mirror having an input coupled to said collector of said driver transistor for passing current thereto which is substantially equal to the base current of said transistor, and an output; and
   a second current mirror having an input coupled to said output of said first current mirror and an output coupled to said emitter of said transistor for sourcing current therefrom which is a function of said base current of said transistor amplified by a gain of said first and second current mirrors such that the apparent alpha of said transistor is increased.

10. The alpha enhancing circuit according to claim 9 wherein said first current mirror includes:

a first transistor having a collector coupled to said input of said first current mirror, a base coupled to said collector of said first transistor of said first current mirror, and an emitter coupled to a first supply voltage terminal; and a second transistor having a collector coupled to said output of said first current mirror, a base coupled to said collector of said first transistor of said first current mirror, and an emitter coupled to said first supply voltage terminal.

11. The alpha enhancing circuit according to claim 10 wherein said second current mirror includes:
- a first transistor having a collector coupled to said input of said second current mirror, a base coupled to said collector of said first transistor of said second current mirror, and an emitter coupled to a second supply voltage terminal; and
- a second transistor having a collector coupled to said output of said second current mirror, a base coupled to said collector of said first transistor of said second current mirror, and an emitter coupled to said second supply voltage terminal.

12. The alpha enhancing circuit according to claim 11 which further includes:
- first resistive means coupled between said emitter of said transistor and a third supply voltage terminal for sensing current thereto; and
- second resistive means coupled between said emitter of said driver transistor and said output of said second current mirror for providing a minimum operating current through said driver transistor.

13. The alpha enhancing circuit according to claim 12 wherein said first current mirror further includes:
- a first resistor coupled between said base and said collector of said first transistor;
- a second resistor coupled between said emitter of said first transistor and said first supply voltage terminal; and
- a third resistor coupled between said emitter of second transistor and said first supply voltage terminal.

14. The alpha enhancing circuit according to claim 13 wherein said second current mirror further includes:
- a first resistor coupled between said base and said collector of said first transistor;
- a second resistor coupled between said emitter of said first transistor and said second supply voltage terminal; and
- a third resistor coupled between said emitter of second transistor and said second supply voltage terminal.

15. A circuit for enhancing the alpha of a transistor by which the apparent emitter current of the transistor is made substantially equal to the collector current of the transistor which is sourced to a utilization means, comprising:
- current supplying means coupled to an input signal and to the base of the transistor for passing base current thereto;
- a first current mirror having an input responsive to said current supplying means for passing current thereto which is substantially equal to the base current of the transistor, and an output; and
- a second current mirror having an input coupled to said output of said first current mirror and an output coupled to the emitter of the transistor for sourcing current thereto which is a function of the base current of the transistor amplified by a gain of said first and second current mirrors such that the apparent alpha of the transistor is increased.

16. The circuit according to claim 15 wherein said first current mirror includes:
- a first transistor having a collector coupled to said input of said first current mirror, a base coupled to said collector of said first transistor of said first current mirror, and an emitter coupled to a first supply voltage terminal; and
- a second transistor having a collector coupled to said output of said first current mirror, a base coupled to said collector of said first transistor of said first current mirror, and an emitter coupled to said first supply voltage terminal.

17. The circuit according to claim 16 wherein said second current mirror includes:
- a first transistor having a collector coupled to said input of said second current mirror, a base coupled to said collector of said first transistor of said second current mirror, and an emitter coupled to a second supply voltage terminal; and
- a second transistor having a collector coupled to said output of said second current mirror, a base coupled to said collector of said first transistor of said second current mirror, and an emitter coupled to said second supply voltage terminal.

18. The circuit according to claim 17 wherein said current supplying means includes:
- a transistor having a collector coupled to said input of said first current mirror, a base coupled to an input signal, and an emitter coupled to said base of the transistor.

19. The circuit according to claim 18 which further includes:
- first resistive means coupled between the emitter of the transistor and a third supply voltage terminal for sensing current thereto; and
- second resistive means coupled between said emitter of said transistor of said current supplying means and said output of said second current mirror for providing a minimum operating current through said transistor of said current supplying means.

20. The circuit according to claim 19 wherein said first current mirror further includes:
- a first resistor coupled between said base and said collector of said first transistor;
- a second resistor coupled between said emitter of said first transistor and said first supply voltage terminal; and
- a third resistor coupled between said emitter of second transistor and said first supply voltage terminal.

21. The circuit according to claim 20 wherein said second current mirror further includes:
- a first resistor coupled between said base and said collector of said first transistor;
- a second resistor coupled between said emitter of said first transistor and said second supply voltage terminal; and
- a third resistor coupled between said emitter of second transistor and said second supply voltage terminal.

* * * * *